(12) United States Patent
Kawasumi

(10) Patent No.: US 6,584,026 B2
(45) Date of Patent: Jun. 24, 2003

(54) SEMICONDUCTOR INTEGRATED CIRCUIT CAPABLE OF ADJUSTING INPUT OFFSET VOLTAGE

(75) Inventor: Atsushi Kawasumi, Yokohama (JP)

(73) Assignee: Kabushiki Kaisha Toshiba, Kanagawa-ken (JP)

(*) Notice: Subject to any disclaimer, the term of this patent is extended or adjusted under 35 U.S.C. 154(b) by 0 days.

(21) Appl. No.: 09/892,902

(22) Filed: Jun. 28, 2001

(65) Prior Publication Data

US 2002/0024851 A1 Feb. 28, 2002

(30) Foreign Application Priority Data

Jun. 28, 2000 (JP) .................................... 2000-194304

(51) Int. Cl.$^7$ ................................................ G11C 7/00
(52) U.S. Cl. .................. 365/205; 365/208; 365/156; 327/55
(58) Field of Search .......................... 365/205, 207, 365/208, 154, 156; 327/55

(56) References Cited

U.S. PATENT DOCUMENTS

| 4,535,427 A | * | 8/1985 | Jiang ........................ 365/205 |
| 5,568,438 A | | 10/1996 | Penchuk |
| 5,650,971 A | * | 7/1997 | Longway et al. ............ 365/207 |
| 5,835,432 A | * | 11/1998 | Nakano ........................ 365/205 |
| 5,982,689 A | * | 11/1999 | Takahashi .................... 365/205 |
| 5,991,219 A | | 11/1999 | Nakashima |
| 6,134,163 A | * | 10/2000 | Takahashi .................... 365/205 |
| 6,184,722 B1 | * | 2/2001 | Hayakawa .................... 327/55 |
| 6,323,698 B1 | * | 11/2001 | Fletcher ........................ 327/100 |

FOREIGN PATENT DOCUMENTS

| JP | 58108090 | 6/1983 |
| JP | 61-29070 | 7/1986 |
| JP | 6-314490 | 11/1994 |
| JP | 7-211081 | 8/1995 |
| JP | 7-302497 | 11/1995 |

* cited by examiner

Primary Examiner—David Nelms
Assistant Examiner—Gene N. Auduong
(74) Attorney, Agent, or Firm—Banner & Witcoff, Ltd.

(57) ABSTRACT

A semiconductor integrated circuit including tow input nodes forming a pair; two output nodes configured to output amplification signals in accordance with a difference in signals inputted to the two input nodes; and at least one switching circuit for switching to a specific state in order to detect an input offset voltage of the semiconductor integrated circuit before a signal to be amplified is inputted to the input node; and the amplification signals are outputted for the two output nodes in a state that the input offset voltage of the semiconductor integrated circuit is corrected.

23 Claims, 11 Drawing Sheets

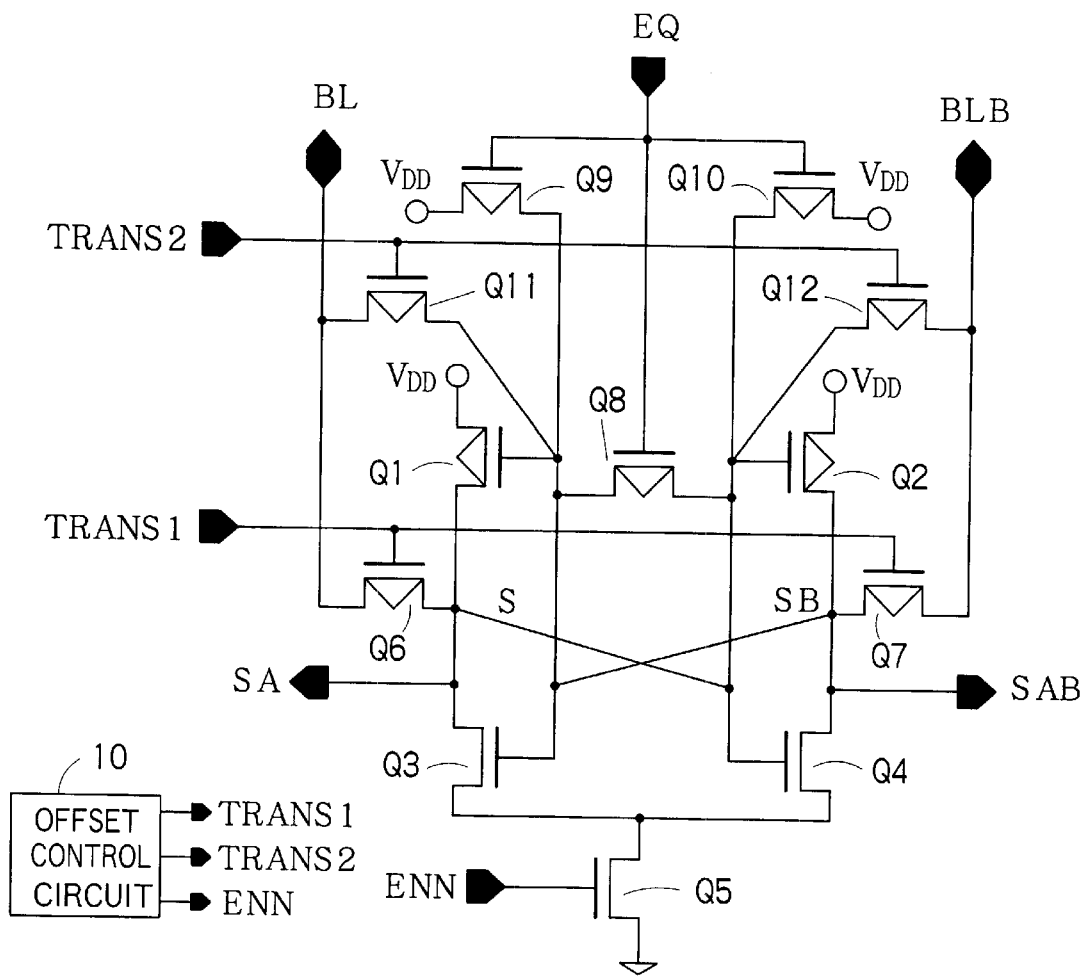
F I G. 1
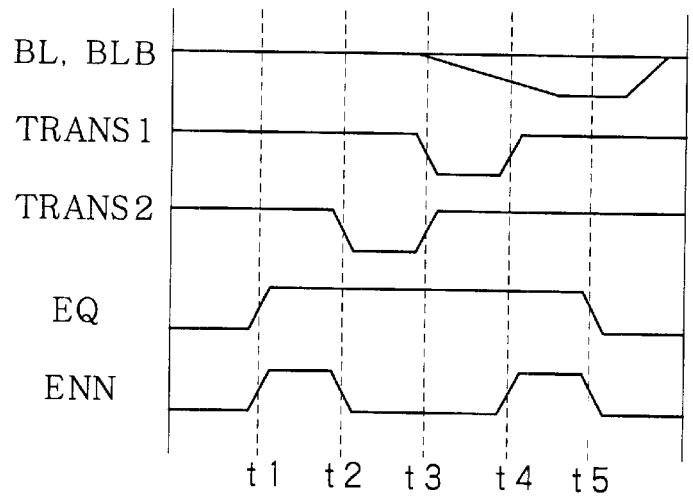
F I G. 2

DESCRIPTION OF CIRCUIT OPERATION
  WHEN OFFSET NEED NOT TO BE CORRECTED → NONE
  WHEN INCREASING MARGIN FOR READING "1" (BL=H,BLB=L) → DISCONNECT F1
  WHEN INCREASING MARGIN FOR READING "0" (BL=L,BLB=H) → DISCONNECT F1 AND F2

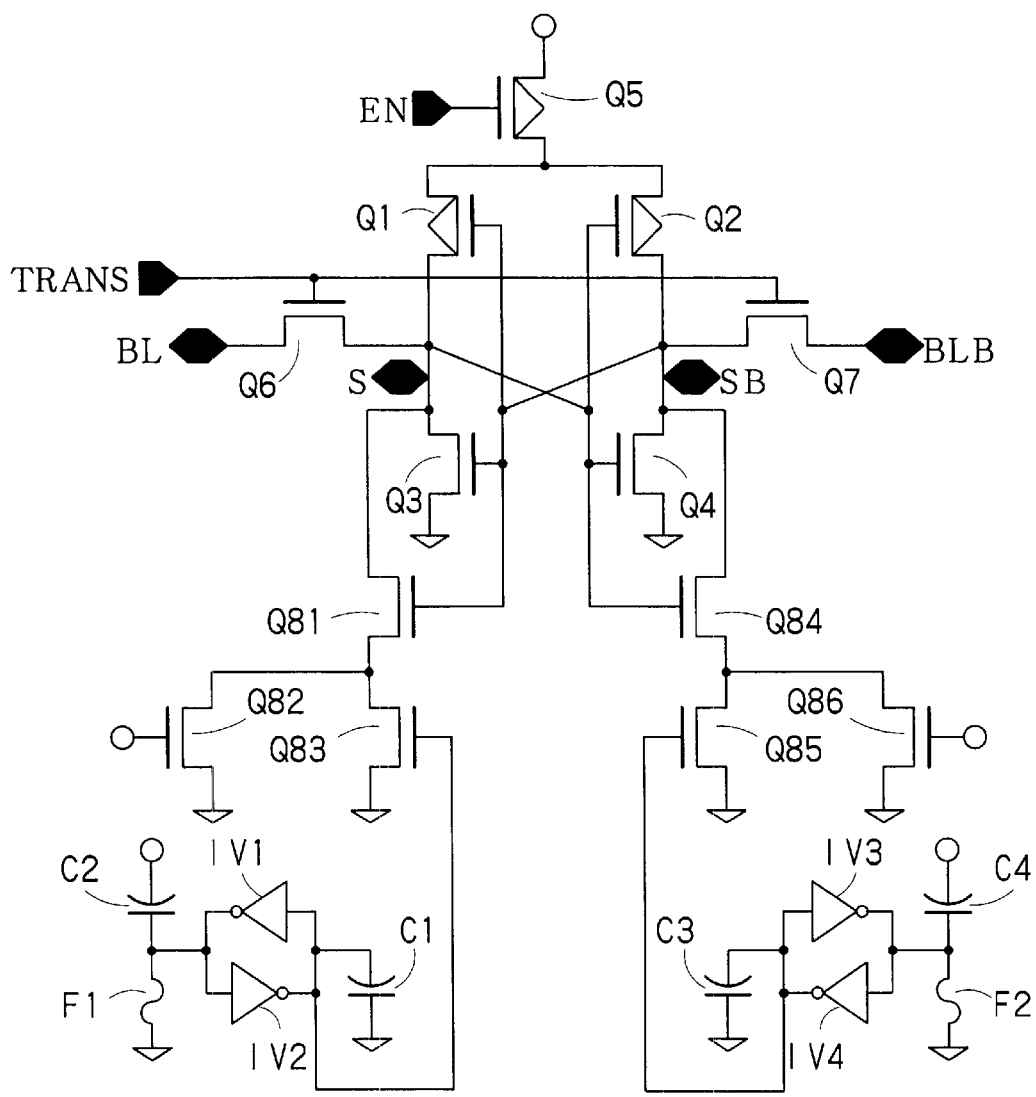
F I G. 12

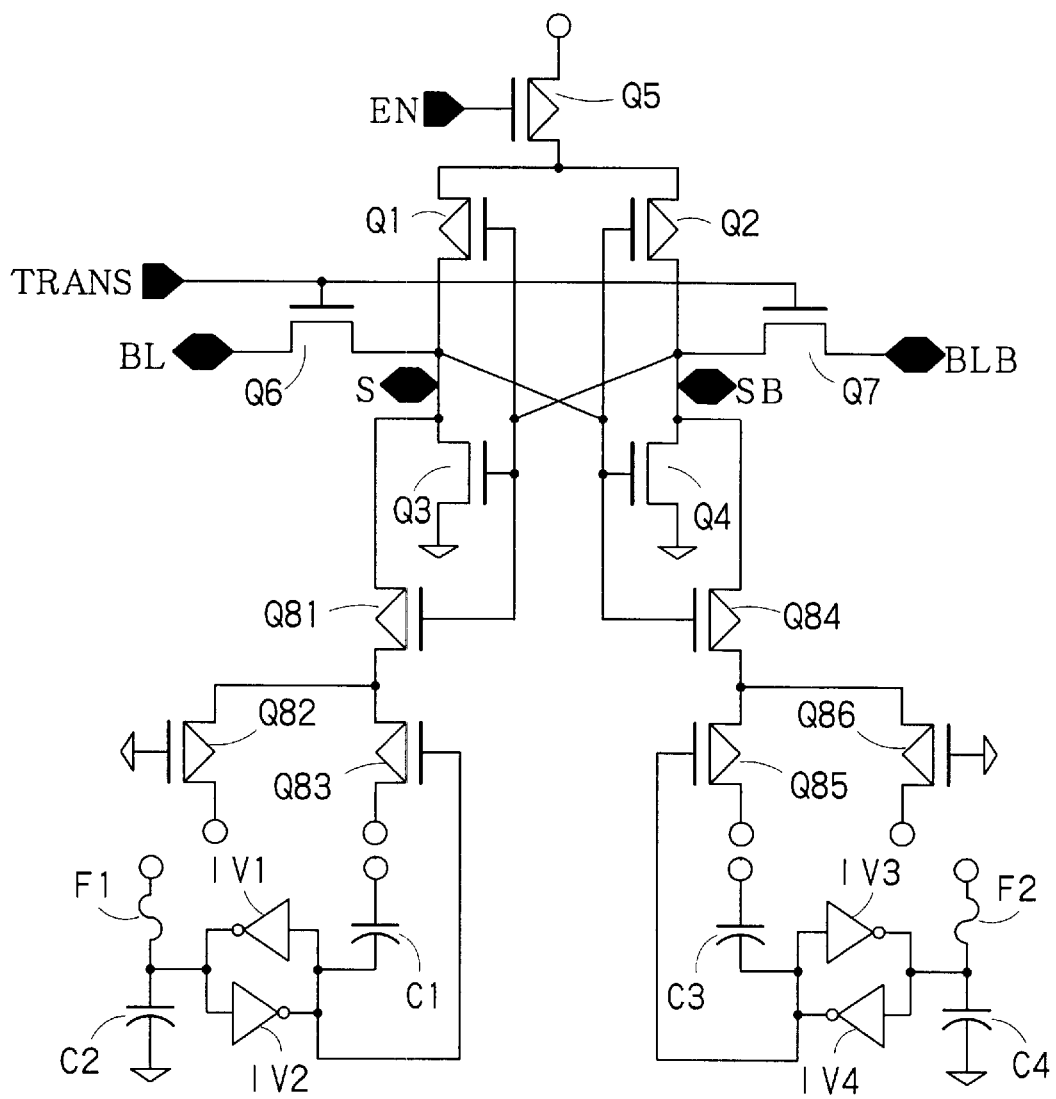
F I G. 14

SEMICONDUCTOR INTEGRATED CIRCUIT CAPABLE OF ADJUSTING INPUT OFFSET VOLTAGE

CROSS REFERENCE TO RELATED APPLICATIONS

This application claims benefit of priority under 35 U.S.C. §119 to Japanese Patent Application No. 2000-194304, filed on Jun. 28, 2000, the entire contents of which are incorporated by reference herein.

BACKGROUND OF THE INVENTION (i) Field of the Invention

The present invention relates to a semiconductor integrated circuit for outputting a voltage in accordance with a voltage difference between two data lines (for example, bit lines) and aims at a circuit used for a sense amplification circuit and the like such as an SRAM (Static Random Access Memory).

(ii) Related Background Art

In a memory such as an SRAM, data read from a memory cell through a bit line is amplified by a sense amplifier and then outputted.

FIG. 15 is a circuit diagram of a conventional sense amplifier. The illustrated sense amplifier includes: a flip flop composed of PMOS transistors Q1 and Q2 and NMOS transistors Q3 and Q4 for latching a voltage in accordance with a voltage difference between a pair of bit lines; an NMOS transistor Q5 for switching whether source terminals of the NMOS transistors Q3 and Q4 are set to a ground voltage; PMOS transistors Q6 and Q7 for switching whether voltages of bit lines BL and BLB are fetched to the flip flop; a PMOS transistor Q8 for equalization; and PMOS transistors Q9 and Q10 for pre-charging.

By turning on the NMOS transistor Q5, a very small voltage difference between a pair of bit lines BL and BLB is amplified by the flip flop and outputted from terminals SA and SAB (nodes S and SB).

Further, when the PMOS transistors Q8, Q9 and Q10 for equalization and pre-charging are in the ON state, the flip flop does not perform the latch operation, and both the nodes S and SB are pre-charged to the high level. When carrying out pre-charging, the NMOS transistor Q5 is turned off so as to prevent a passing electric current from flowing to the flip flop.

The respective transistors Q1 to Q4 composing the flip flop do not necessarily have the same characteristic and it is often the case that these transistors may have different threshold values. Assuming that the threshold values of the PMOS transistor Q1 and the NMOS transistor Q4 are shallow while the threshold values of the PMOS transistor Q2 and the NMOS transistor Q3 are deep, the node S of the flip flop is apt to become the high level, and the node SB tends to become the low level.

At this moment, if the voltage of the bit line BL is lower than that of the bit line BLB and a voltage difference between both the bit lines is small, the flip flop may output a voltage which is in the relationship reversed from the voltage relationship of the bit lines BL and BLB. In general, a minimum voltage difference between a pair of bit lines required for the flip flop to output correct data is called an offset voltage.

The offset voltage of the sense amplifier is determined by fluctuation of the threshold voltages of the transistors composing the sense amplifier. Furthermore, the offset voltage is also influenced by fluctuation of a parasitic capacitance such as wiring resistance or capacitance or asymmetry of a layout. In usual, the offset voltage of the sense amplifier is approximately 50 mV.

The sense amplifier shown in FIG. 15 will now be described in connection with the influence of the offset voltage when the sense amplifier is provided in the SRAM. The capacitance of a pair of the bit lines BL and BLB is approximately 1 pF, and a cell selected by a word line pulls out the electric charge of one of a pair of the bit lines pre-charged to a power supply voltage VDD. As a result, a very small voltage difference appears in a pair of the bit lines, and this voltage difference is amplified by the sense amplifier. At this time, assuming that the offset voltage of the sense amplifier is 50 mv, the time of 0.5 ns is required to give voltage difference of 50 mV to a pair of the bit lines as represented by the following expression (1):

$$1 \text{ pF} \times 50 \text{ mV} \div 100 \text{ }\mu\text{A} = 0.5 \text{ ns} \tag{1}$$

This time is a considerably large time for the memory which operates at a high speed, and it is important to reduce the offset voltage of the sense amplifier in order to increase the speed of the memory.

SUMMARY OF THE INVENTION

In view of the above-described problems, it is an object of the present invention to provide a semiconductor integrated circuit capable of reducing the influence of an offset voltage when amplifying and outputting a voltage in accordance with a voltage difference between first and second data lines.

To achieve this aim, there is provided a semiconductor integrated circuit comprising:

two input nodes forming a pair;

two output nodes configured to output amplification signals in accordance with a difference in signals inputted to said two input nodes; and at least one switching circuit for switching to a specific state in order to detect an input offset voltage of said semiconductor integrated circuit before a signal to be amplified is inputted to said input node; and said amplification signals are outputted from said two output nodes on a state that the input offset voltage of said semiconductor integrated circuit is corrected.

Further, there is provided a semiconductor integrated circuit comprising:

first and second transistors having gate terminals being connected to each other and one drain terminal being connected to the other drain terminal;

third and fourth transistors having gate terminals being connected to each other and one drain terminal being connected to the other drain terminal;

a fifth transistor connected between a connection point of said respective drain terminals of said first and second transistors and a first data line;

a sixth transistor connected between a connection point of said respective drain terminals of said third and fourth transistors and a second data line; and an offset supply circuit configured to supply an offset voltage to at least one of said first and second data lines before turning on said fifth and sixth transistors in order to cancel out said input offset voltage of said semiconductor integrated circuit, wherein said connection point of said respective drain terminals of said first and second transistors is connected to said respective gate terminals of said third and fourth transistors, and said respective gate terminals of said first and second transistors are connected to a connection point of the respective drain terminals of the third and fourth transistors.

Furthermore, there is provided a semiconductor integrated circuit comprising:

first and second transistors having gate terminals being connected to each other and one drain terminal being connected to the other drain terminal;

third and fourth transistors having gate terminals being connected to each other and one drain terminal being connected to the other drain terminal;

a fifth transistor connected between a connection point of said respective drain terminals of said first and second transistors and a first data line;

a sixth transistor connected between a connection point of said respective drain terminals of said third and fourth transistors and a second data line;

a seventh transistor connected between said respective gate terminals of said first and second transistors and said first data line; and an eighth transistor connected between said respective gate terminals of said third and fourth transistors and said second data line, wherein said connection point of said respective drain terminals of said first and second transistors is connected to said respective gate terminals of said third and fourth transistors, and said respective gate terminals of said first and second transistors are connected to said respective drain terminals of said third and fourth transistors.

Further, there is provided a semiconductor integrated circuit comprising:

first and second transistors having gate terminals being connected to each other and one drain terminal being connected to the other drain terminal;

third and fourth transistors having gate terminals being connected to each other and one drain terminal being connected to the other drain terminal;

a fifth transistor connected between a connection point of said respective drain terminals of said first and second transistors and a first data line;

a sixth transistor connected between a connection point of said respective drain terminals of said third and fourth transistors and a second data line;

a seventh transistor connected between said respective gate terminals of said first and second transistors and said first data line; and an eighth transistor connected between said respective gate terminals of said third and fourth transistors and said second data line, wherein said connection point of said respective drain terminals of said first and second transistors is connected to said respective gate terminals of said third and fourth transistors, and said respective gate terminals of said first and second transistors are connected to said respective drain terminals of said third and fourth transistors.

Furthermore, there is provided a semiconductor integrated circuit comprising:

first and second transistors having one source terminal being connected to the other drain terminal;

third and fourth transistors having one source terminal being connected to the other drain terminal;

a fifth transistor connected between source terminals of said second and fourth transistors and a first voltage terminal;

a sixth transistor connected between drain terminals of said first and third transistors and a second voltage terminal;

a seventh transistor connected between drain terminals of said first and third transistors and said first voltage terminal; and an eighth transistor connected between source terminals of said second and fourth transistors and said second voltage terminal, wherein a first data line is connected to gate terminals of said first and fourth transistors, a second data line being connected to gate terminals of said second and third transistors.

In addition, there is provided a semiconductor integrated circuit comprising:

first and second transistors having one source terminal being connected to the other drain terminal;

third and fourth transistors having one source terminal being connected to the other drain terminal;

a fifth transistor connected between source terminals of said second and fourth transistors and a first voltage terminal;

a sixth transistor connected between drain terminals of said first and third transistors and a second voltage terminal;

a seventh transistor connected between drain terminals of said first and third transistors and said first voltage terminal; and an eighth transistor connected between source terminals of said second and fourth transistors and said second voltage terminal, wherein a first data line is connected to gate terminals of said first and fourth transistors, a second data line being connected to gate terminals of said second and third transistors.

Furthermore, there is provided a semiconductor integrated circuit comprising:

first and second transistors having one source terminal connected to the other drain terminal;

third and fourth transistors having one source terminal connected to the other drain terminal;

a fifth transistor connected between said source terminals of said second and fourth transistors and a first voltage terminal;

a sixth transistor connected between said drain terminals of said first and third transistors and a second voltage terminal;

a seventh transistor connected between said source terminals of said second and fourth transistors and said second voltage terminal;

an eighth transistor having a gate terminal being connected to a gate terminal of said first transistor and having a drain terminal being connected to said source terminal of said first transistor and a gate terminal of said third transistor;

a ninth transistor having a gate terminal being connected to said gate terminal of said third transistor and having a drain terminal being connected to said source terminal of said third transistor and said gate terminal of said first transistor; and a tenth transistor connected between source terminals of said eighth and ninth transistors and said first voltage terminal, wherein a first data line is connected to a gate terminal of said second transistor and a second data line is connected to a gate terminal of said fourth transistor.

Furthermore, there is provided a semiconductor integrated circuit comprising:

first and second transistors having gate terminals being connected to each other and one drain terminal being connected to the other drain terminal;

third and fourth transistors having gate terminals being connected to each other and one drain terminal being connected to the other drain terminal;

a fifth transistor connected between a connection point of said both drain terminals of said first and second transistors and a first data line;

a sixth transistor connected between a connection point of said both drain terminals of said third and fourth transistors and a second data line;

a first voltage setting circuit capable of further strongly (further weakly) holding low-level voltages of said both gate terminals of said first and second transistors; and a second voltage setting circuit capable of further strongly (further weakly) holding low-level voltage of said both gate terminals of said third and fourth transistors, wherein said connection point of said both drain terminals of said first and second transistors is connected to said respective gate terminals of said third and fourth transistors, and said respective gate terminals of said first and second transistors are connected to said connection point of said both drain terminals of said third and fourth transistors.

According to the present invention, since an amplification signal in accordance with a difference between signals inputted to the two input nodes is outputted with a detected input offset voltage being corrected, the amplification signal is not affected by the input offset voltage.

Moreover, an offset voltage caused due to fluctuation of threshold voltages of the first to fourth transistors composing the flip flop is detected, and the voltages of the first and second data lines are corrected so as to cancel out the offset voltage. Therefore, the influence of the offset voltage can be reduced when amplifying and outputting a voltage in accordance with a voltage difference between the first and second data lines.

BRIEF DESCRIPTION OF THE DRAWINGS

FIG. 1 is a circuit diagram showing a first embodiment of a semiconductor integrated circuit according to the present invention;

FIG. 2 is a timing chart of each signal inputted to the semiconductor integrated circuit illustrated in FIG. 1;

FIG. 12 is a circuit diagram showing an example in which a transistor Q83 is in the ON state with fuses F1 and F2 being not disconnected;

FIG. 14 is a circuit diagram showing a modification of FIG. 12 having a PMOS transistor.

DESCRIPTION OF THE PREFERRED EMBODIMENTS

A semiconductor integrated circuit according to the present invention will now be concretely described hereinafter with reference to the accompanying drawings. As an example of the semiconductor integrated circuit, a sense amplifier provided inside an SRAM will be mainly explained hereunder.

(First Embodiment)

Figure 15:
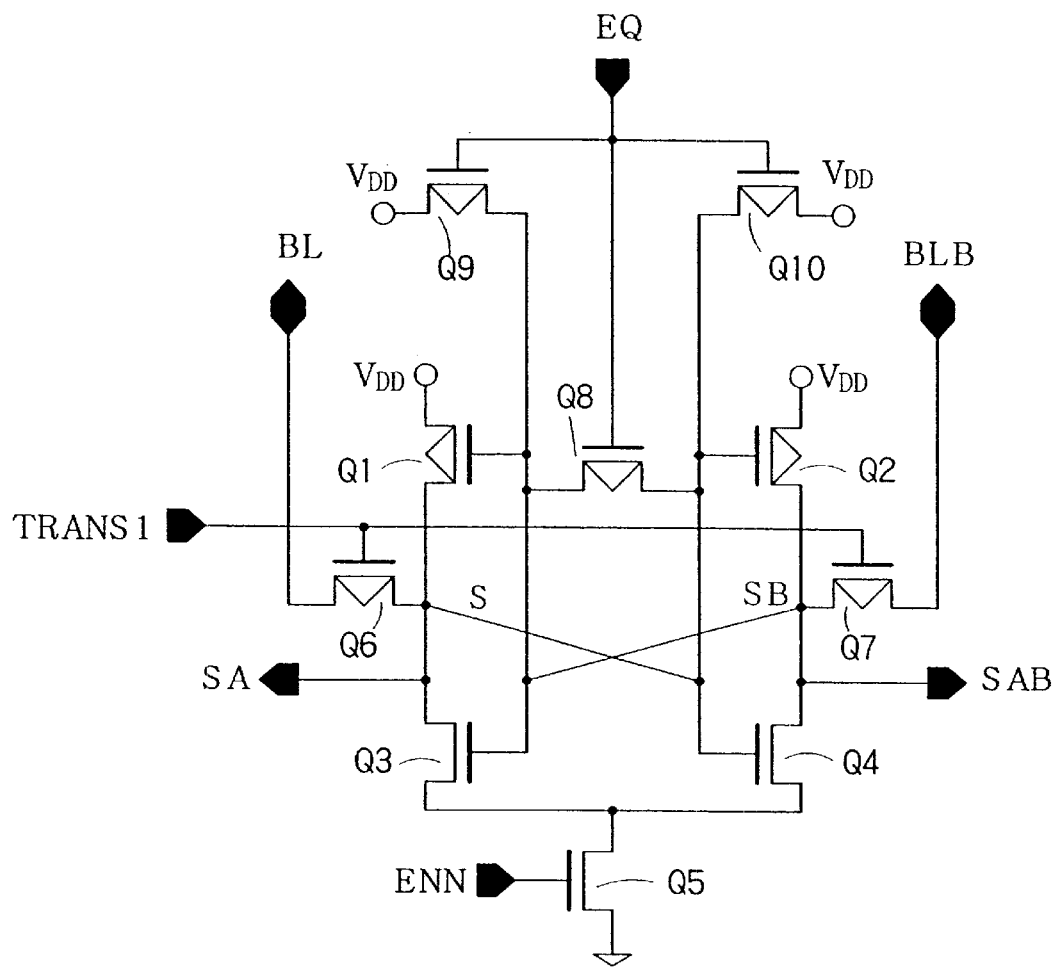
FIG. 15 is a circuit diagram showing a conventional sense amplifier.

FIG. 1 is a circuit diagram of a first embodiment of a semiconductor integrated circuit according to the present invention. As compared with the circuit illustrated in FIG. 15, the semiconductor integrated circuit illustrated in FIG. 1 is characterized in that PMOS transistors Q11 and Q12 are provided in order to cancel out an offset voltage of the sense amplifier. Other structures than the PMOS transistors Q11 and Q12 are similar to those of the circuit shown in FIG. 12, and this semiconductor integrated circuit is provided with PMOS transistors Q1 and Q2 and NMOS transistors Q3 and Q4 composing a flip flop, an NMOS transistor Q5 for switching whether source terminals of the NMOS transistors Q3 and Q4 are connected to a ground terminal, PMOS transistors Q6 and Q7 for switching whether voltages of bit lines BL and BLB are fetched to the flip flop, a PMOS transistor Q8 for equalization, and transistors Q9 and Q10 for pre-charging.

The PMOS transistor Q11 is connected between a node SB in the flip flop and the bit line BL, and the PMOS transistor Q12 is connected between a node S in the flip flop and the bit line BLB. The PMOS transistors Q11 and Q12 are turned on and off in accordance with a signal TRANS2, and the PMOS transistors Q6 and Q7 are turned on and off in accordance with a signal TRANS1.

FIG. 2 is a timing chart of each signal inputted to the semiconductor integrated circuit, and shows respective timings with a signal TRANS1 supplied to gate terminals of the bit lines BL and BLB and the PMOS transistors Q6 and Q7, a signal TRANS2 supplied to gate terminals of the PMOS transistors Q11 and Q12, a signal EQ supplied to gate terminals of the PMOS transistors Q8, Q9 and Q10; and a signal ENN supplied to a gate terminal of the NMOS transistor Q5. These signals are outputted from, for example, an offset control circuit 10 illustrated in FIG. 1.

Before the time t1, the PMOS transistors Q8, Q9 and Q10 are turned on, and the nodes S and SB in the flip flop are pre-charged to the high level.

At the time t1, the PMOS transistors Q8, Q9 and Q10 are turned off, and the NMOS transistor Q5 is turned on. As a result, the nodes S and SB in the flip flop have voltages determined by fluctuation of threshold voltages of the transistors Q1 to Q4. Specifically, since the flip flop becomes the bistable state, one of the nodes S and SB has a high-level voltage and the other has the low-level voltage.

As factors determining which one of the nodes S and SB has the high-level voltage, there can be considered fluctuation of threshold voltages of the respective transistors Q1 to Q4 composing the flip flop, fluctuation of characteristics of parasitic capacitances such as wiring resistance or capacitance, the asymmetry property of the device layout, and others.

At the time t2, the NMOS transistor Q5 is turned off, and the PMOS transistors Q11 and Q12 are turned on. The voltage of the bit line BLB is influenced by the voltage of node S, and the voltage of the bit line BL is influenced by the node SB. For example, it is assumed that the voltage of the node S is higher than that of the node SB immediately before the time t2. In this case, at the time t2, control is effected in such a manner that the voltage of the bit line BLB connected to the node S becomes higher than that of the bit line BL.

Subsequently, at the time t3, the PMOS transistors Q11 and Q12 are turned off, and the PMOS transistors Q6 and Q7 are turned on. Consequently, the bit line BL is short-circuited with the node S, and the bit line BLB is short-circuited with the node SB. Further, after the time t3, data read from the memory cell is supplied to the bit lines BL and BLB.

For example, it is assumed that the voltage of the node S is higher than that of the node SB immediately before the time t2. Since control is carried out in such a manner the voltage of the bit line BL is lower than that of the bit line BLB from the time t2 to the time t3, the voltage of the node S is lowered after the time t3. As a result, the offset voltage can be canceled out.

Then, in a period from the time t4 to the time t5, the offset voltage is again detected as similar to the period from the time t1 to the time t2.

As described above, in the first embodiment, before a voltage difference between a pair of the bit lines BL and BLB is sensed, the offset voltage of the flip flop is detected, and the sensing operation is carried out after adjusting the voltages of the bit lines BL and BLB in accordance with the offset voltage. Therefore, the offset voltage can be canceled out, and a voltage difference between a pair of the bit lines BL and BLB can be amplified without being affected by the offset voltage of the flip flop. Thus, even if a voltage difference between a pair of the bit lines is sufficiently small, the voltage in accordance with a voltage difference can be assuredly outputted from the flip flop, thereby obtaining the sense amplifier with the excellent sensitivity.

(Second Embodiment)

A second embodiment cancels out the offset voltage by reversing a direction of the power supply voltage supplied to the specified circuit block before sensing the voltage difference between a pair of the bit lines and during sensing.

Figure 3:
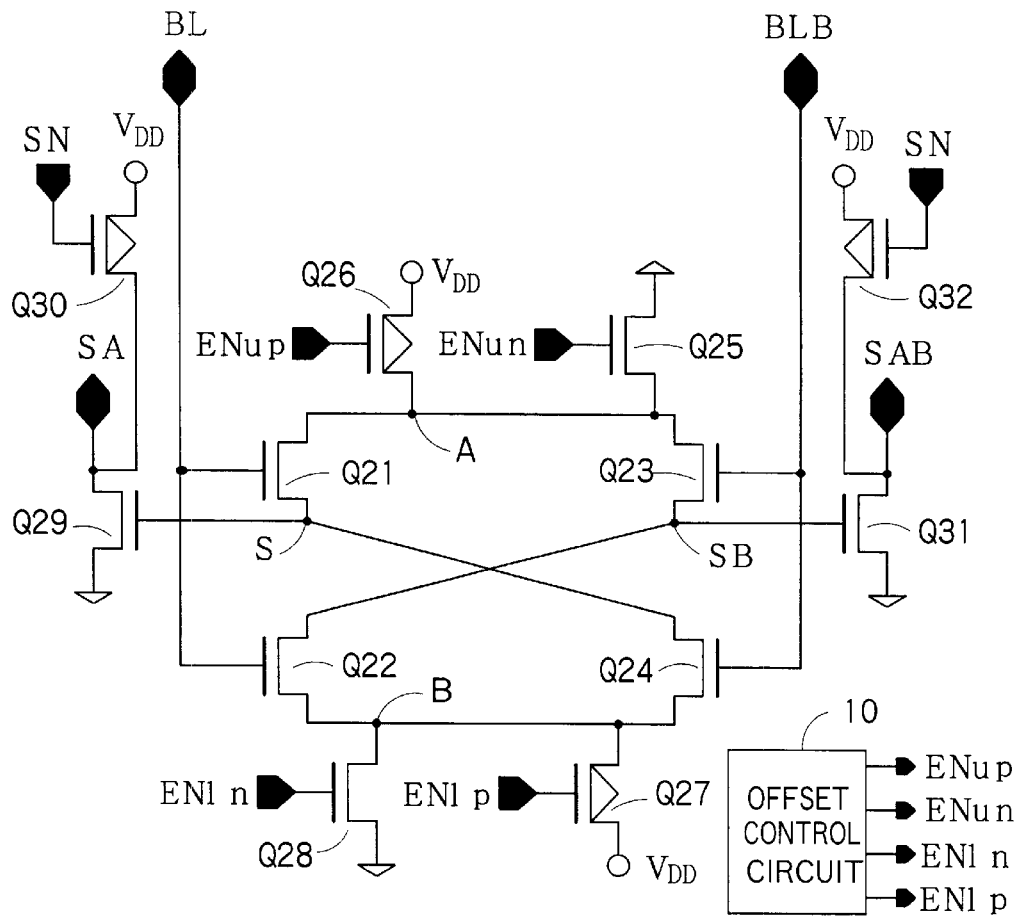
FIG. 3 is a circuit diagram showing a second embodiment of a semiconductor integrated circuit according to the present invention.

FIG. 3 is a circuit diagram showing the second embodiment of the semiconductor integrated circuit according to the present invention. The semiconductor integrated circuit in FIG. 3 includes: NMOS transistors Q21 to Q24 composing a specified circuit block; an NMOS transistor Q25 connected between drain terminals of the NMOS transistors Q21 and Q23 and a ground terminal; a PMOS transistor Q26 connected between drain terminals of the NMOS transistors Q21 and Q23 and a power supply terminal; a PMOS transistor Q27 connected between source terminals of the NMOS transistors Q22 and Q24 and the power supply terminal; an NMOS transistor Q28 connected between source terminals of the NMOS transistors Q22 and Q24 and the ground terminal; an NMOS transistor Q29 which is turned on/off in accordance with the logic of a node S in the specified circuit block; a PMOS transistor Q30 connected between a drain terminal of the transistor Q29 and the power supply terminal; an NMOS transistor Q31 which is turned on/off in accordance with the logic of a node SB in the specified circuit block; and a PMOS transistor Q32 connected between a drain terminal of the transistor Q31 and the power supply terminal.

Incidentally, although the transistor for equalization and a transistor for pre-charging are omitted in FIG. 3, these transistors may be provided.

A bit line BL is connected to gate terminals of the NMOS transistors Q21 and Q22, and a bit line BLB is connected to gate terminals of the NMOS transistors Q23 and Q24.

Figure 4:
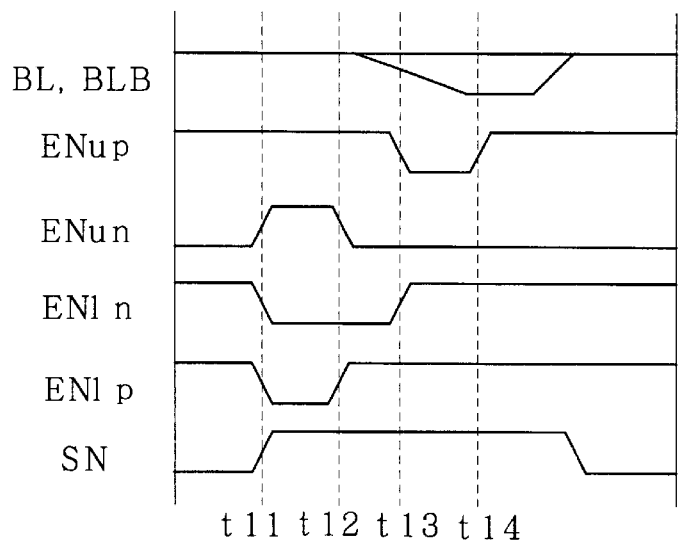
FIG. 4 is a timing chart of each signal inputted to the semiconductor integrated circuit depicted in FIG. 3.

FIG. 4 is a timing chart of each signal inputted to the semiconductor integrated circuit illustrated in FIG. 3, and shows timings of a signal ENup inputted to the bit lines BL and BLB and the gate terminal of the PMOS transistor Q26, a signal ENun inputted to the gate terminal of the NMOS transistor Q25, a signal ENln inputted to the gate terminal of the NMOS transistor Q28, and a signal ENlp inputted to the gate terminal of the PMOS transistor Q27. These signals are outputted from, e.g., the offset control circuit 10 shown in FIG. 3.

In a period from the time t11 to the time t12, the transistors Q25 and Q27 are turned on, and then a node A that the transistors Q21 and Q23 are commonly connected with the transistor Q25 becomes the ground potential. As a result, a node B that the NMOS transistors Q22 and Q24 are commonly connected with the transistor Q27 becomes the power supply potential VDD. Further, since all the NMOS transistors Q21 to Q24 in the specified circuit block are turned on, the node S in the specified circuit block becomes (VDD/2+$\Delta$V) and the node SB becomes (VDD/2+$\Delta$V'). Here, $\Delta$V and $\Delta$V' are voltages determined by fluctuation in the threshold voltages of the NMOS transistors, and |$\Delta$V−$\Delta$V'| is the offset voltage.

In a period from the time t12 to the time t13, the power supply voltage is not supplied to the specified circuit block, and the voltages immediately before the time t12 are held at the nodes S and SB.

In a period from the time t13 to the time t14, the power supply voltage and the ground voltage are supplied to the specified circuit block in a direction reversed from that in the period from the time t11 to the time t12. Specifically, the transistors Q26 and Q28 are turned on, the potential of the node A becomes the power supply potential, and the potential of the node B becomes the ground potential.

As described above, by applying the voltages to the specified circuit block in a direction reversed from that in the period from the time t11 to the time t12, the offset voltage |$\Delta$V−$\Delta$V'| of the nodes S and SB can be canceled out.

After the time t13, since data read from the memory cell is supplied to the bit lines BL and BLB, a voltage difference between the bit lines BL and BLB can be sensed with the offset voltage being canceled out.

As mentioned above, in the second embodiment, since the power supply voltage and the ground voltage are supplied to the specified circuit block before performing the sensing operation in a direction reversed from that during the sensing operation, the sensing operation can be effected with the offset voltage of the sense amplifier being canceled out, thereby obtaining the sense amplifier with the excellent sensitivity.

(Third Embodiment)

A third embodiment is common to the second embodiment in that the power supply voltage and the ground voltage are supplied to the specified circuit block before the sensing operation in a direction reversed from that during the sensing operation, but has the circuit configuration different from that of the second embodiment.

Figure 5:
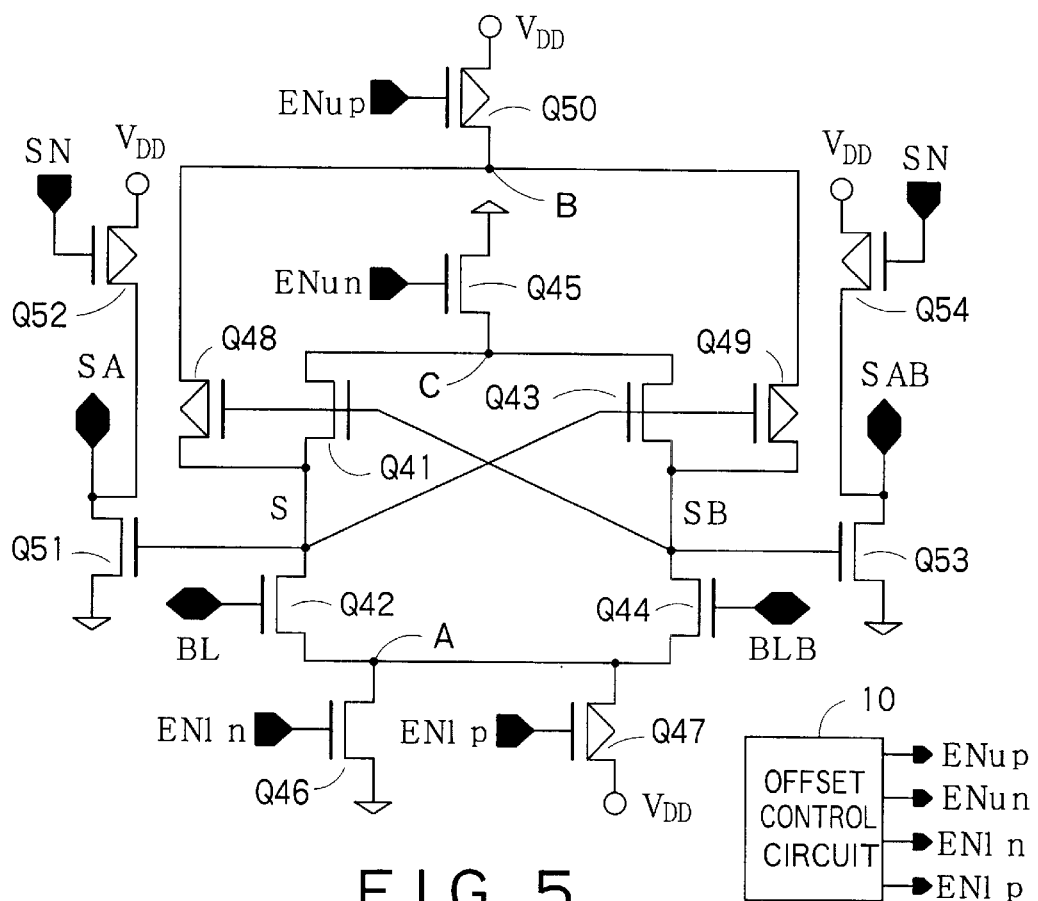
FIG. 5 is a circuit diagram showing a third embodiment of a semiconductor integrated circuit according to the present invention.

FIG. 5 is a circuit diagram of the third embodiment of the semiconductor integrated circuit according to the present invention. The semiconductor integrated circuit shown in FIG. 5 includes: NMOS transistors Q41 to Q44 for composing a specified circuit block; an NMOS transistor Q45 for switching whether the ground voltage is supplied to a connection node C of the NMOS transistors Q41 and Q43; an NMOS transistor Q46 for switching whether the ground voltage is supplied to a node A that the NMOS transistors Q42 and Q44 are commonly connected; an NMOS transistor Q47 for switching whether the power supply voltage is supplied to the node A; PMOS transistors Q48 and Q49; a PMOS transistor Q50 for switching whether the power supply voltage is supplied to source terminals of the PMOS transistors Q48 and Q49; an NMOS transistor Q51 which is turned on/off in accordance with the logic of a node S in the specified circuit block; a PMOS transistor Q52 connected between a drain terminal of the transistor Q51 and the power supply terminal; an NMOS transistor Q53 which is turned on/off in accordance with the logic of a node SB in the specified circuit block; and a PMOS transistor Q54 connected between a drain terminal of the transistor Q53 and the power supply terminal.

A gate terminal of the PMOS transistor Q48 is connected to a gate terminal of the NMOS transistor Q41; and a terminal of the PMOS transistor Q48, to a source terminal of the NMOS transistor Q41. A gate terminal of the PMOS transistor Q49 is connected to a gate terminal of the NMOS transistor Q43; and a terminal of the PMOS transistor Q49 is connected to a terminal of the NMOS transistor Q43.

Figure 6:
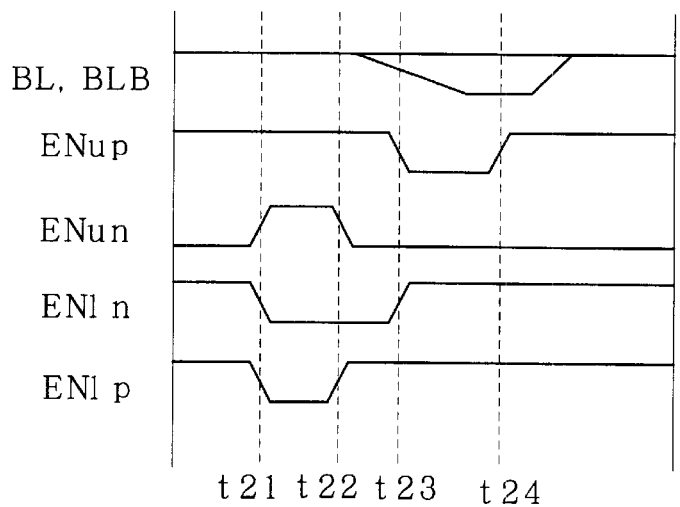
FIG. 6 is a timing chart of each signal inputted to the semiconductor integrated circuit illustrated in FIG. 5.

FIG. 6 is a timing chart of each signal inputted to the semiconductor integrated circuit illustrated in FIG. 5, and shows the timings of a signal ENup inputted to the bit lines BL and BLB and a gate terminal of the PMOS transistor Q50, a signal ENun inputted to the gate terminal of the NMOS transistor Q45, a signal ENln inputted to the gate terminal of the NMOS transistor Q46, and a signal ENlp inputted to the gate terminal of the PMOS transistor Q47. These signals are outputted from, e.g., the offset control circuit 10 illustrated in FIG. 5.

In a period from the time t21 to the time t22, the NMOS transistor Q45 and the PMOS transistor Q47 are turned on, and the drain terminals of the NMOS transistors Q41 and Q43 in the specified circuit block have the ground voltage. Further, the source terminals of the NMOS transistors Q42 and Q44 have the power supply voltage.

At this moment, since the bit lines BL and BLB are on the high level, the NMOS transistors Q42 and Q44 are turned on. Eventually, the potential difference between the nodes S and SB in the specified circuit block have the offset voltage which is determined by fluctuation and the like of the threshold voltages of the NMOS transistors Q41 to Q44.

In a period from the time t22 to the time t23, since the PMOS transistor Q47 and the NMOS transistors Q45 and Q46 are turned off, the nodes S and SB hold the offset voltage.

In a period from the time t23 to the time t24, the PMOS transistor Q47 and the NMOS transistor Q45 are turned off, and the NMOS transistor Q46 and the PMOS transistor Q50 are turned on. As a result, the power supply voltage VDD is supplied to the node B, and the ground voltage is supplied to the node A.

That is, in a period from the time t23 to the time t24, since the power supply voltage and the ground voltage are supplied to the specified circuit block composed of the transistors Q42, Q44, Q48 and Q49 in a direction reversed from that in a period from the time t21 to the time t22, the offset voltage of the nodes S and SB can be canceled out. In this state, data read from the memory cell is supplied to the bit lines BL and BLB, and the sensing operation can be effected without being affected by the offset voltage.

In this manner, as different from the second embodiment, some transistors composing the specified circuit block are changed before and after the sensing operation in the third embodiment. That is, the specified circuit block is composed of the transistors Q41 to Q44 before the sensing operation, and the specified circuit block is composed of the transistors Q43, Q44, Q48 and Q49 during the sensing operation. Even in this case, as similar to the second embodiment, the offset voltage of the sense amplifier can be canceled out by reversing the power supply voltage supplied to the specified circuit block before and during the sensing operation.

(Fourth Embodiment)

A fourth embodiment holds the offset voltage of the sense amplifier detected before the sensing operation by the offset information holding circuit.

Figure 7:
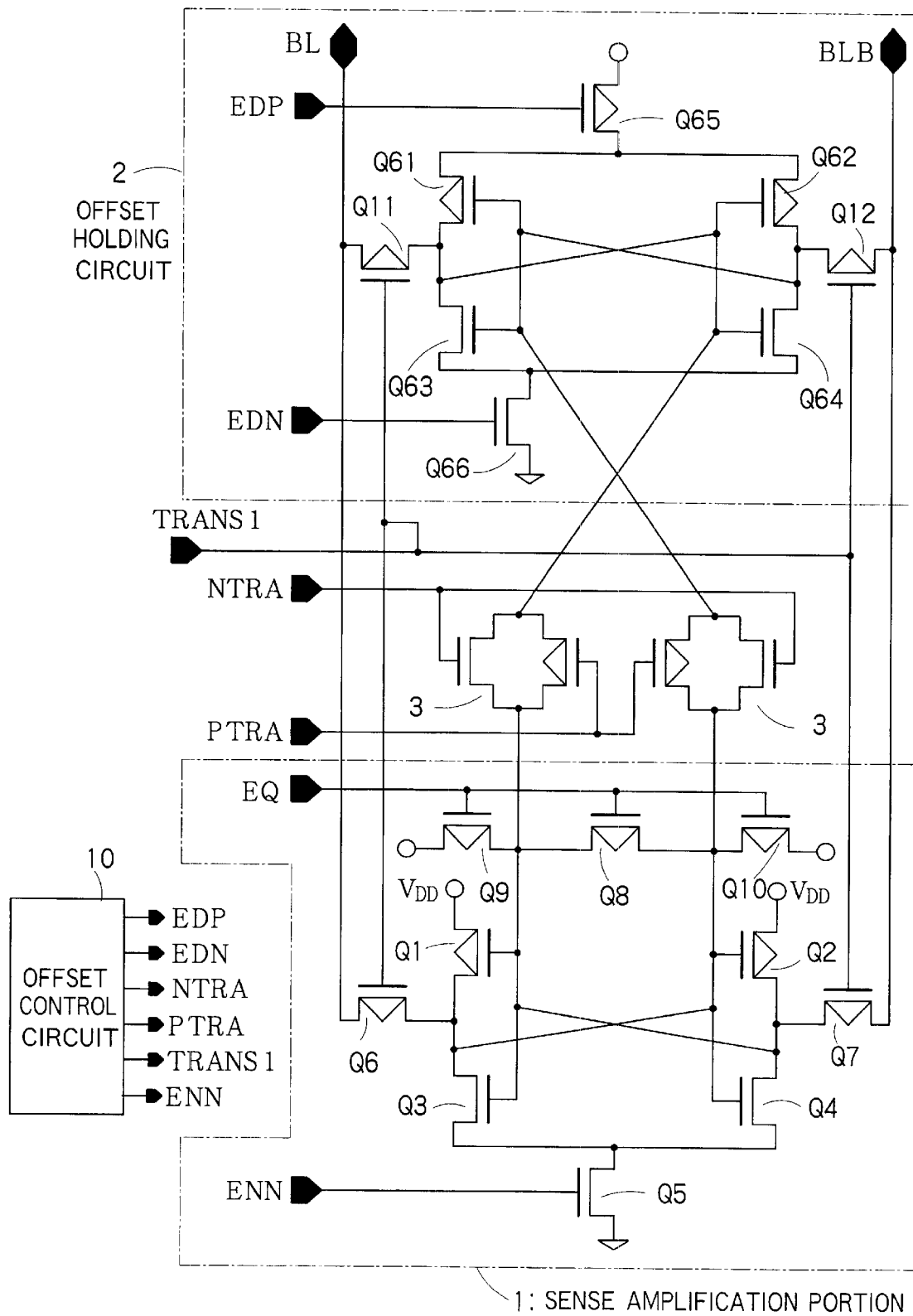
FIG. 7 is a circuit diagram showing a fourth embodiment of a semiconductor integrated circuit according to the present invention.

FIG. 7 is a circuit diagram showing a fourth embodiment of a semiconductor integrated circuit according to the present invention. The semiconductor integrated circuit illustrated in FIG. 7 has: a sense amplification portion 1 having the structure similar to that in FIG. 1; an offset holding circuit 2 for holding the offset voltage information detected by the sense amplification portion 1; and a switching circuit 3 for switching whether the detected offset voltage information is held in the offset holding circuit 2.

The offset holding circuit 2 in FIG. 7 includes: PMOS transistors Q61 and Q62 and NMOS transistors Q63 and Q64 composing the flip flop; a PMOS transistor Q65 for switching whether the power supply voltage VDD is supplied to source terminals of the PMOS transistors Q61 and Q62; an NMOS transistor Q66 for switching whether voltages at source terminals of the NMOS transistors Q63 and Q64 are changed to the ground voltage; and PMOS transistors Q11 and Q12 for switching whether the offset voltage held in the flip flop is supplied to the bit lines BL and BLB.

Figure 8:
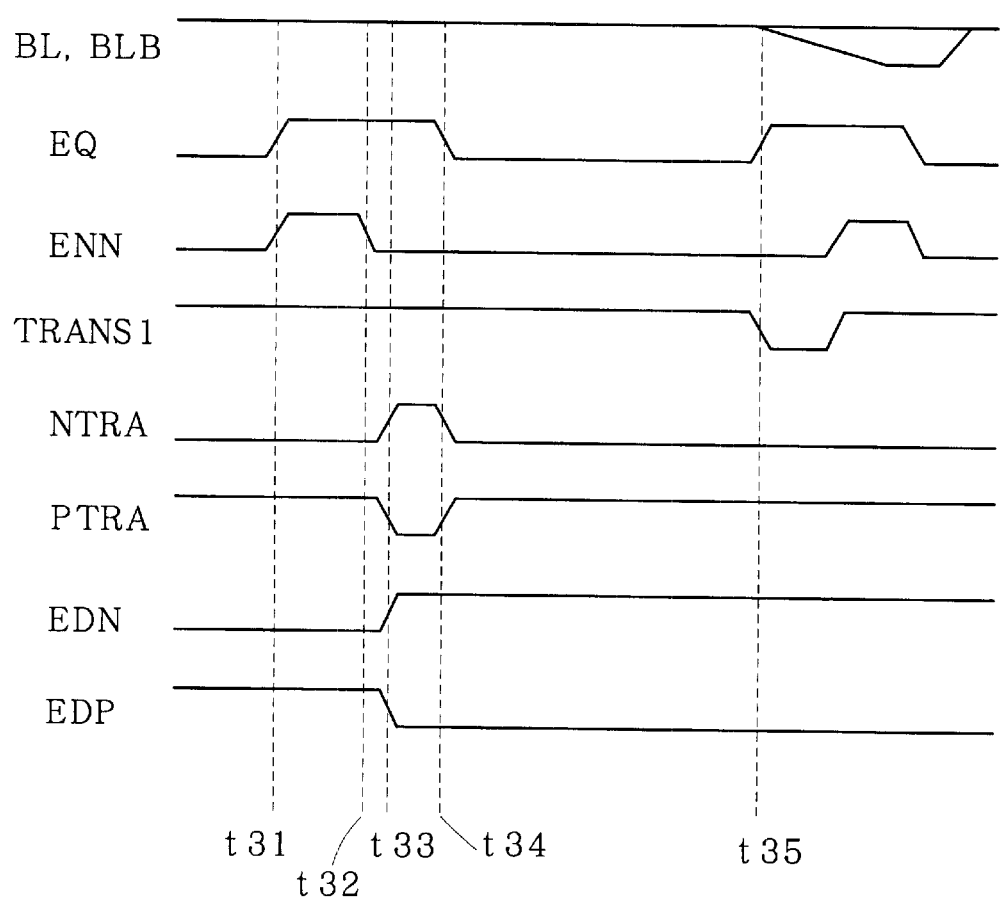
FIG. 8 is a timing chart of each signal inputted to the semiconductor integrated circuit illustrated in FIG. 7.

FIG. 8 is a timing chart of each signal inputted to the semiconductor integrated circuit illustrated in FIG. 7, and shows respective timing waveforms of a signal EQ inputted to the bit lines BL and BLB and gate terminals of the PMOS transistors Q8 to Q10; a signal ENN inputted to a gate terminal of the NMOS transistor Q5; a signal TRANS1 inputted to gate terminals of the PMOS transistors Q6 and Q11; a signal NTRA inputted to gate terminals of the NMOS transistors in the switching circuit 3; a signal PTRA inputted to gate terminals of the PMOS transistors in the switching circuit 3; a signal EDN inputted to a gate terminal of the NMOS transistor Q66; and a signal EDP inputted to a gate terminal of the PMOS transistor Q65. These signals are outputted from, e.g., the offset control circuit 10 illustrated in FIG. 7.

In a period from the time t31 to the time t32, a voltage of one of the nodes S and SB becomes a high-level voltage and a voltage of the other becomes a low-level voltage due to fluctuation and the like of the threshold voltages of the transistors Q1 to Q4 in the sense amplification portion 1.

The voltages of the nodes S and SB are supplied to and held in the offset holding circuit 2 through the switching circuit 3 in a period from the time t33 to the time t34.

At the time t35, the PMOS transistors Q6, Q7, Q11 and Q12 are turned on, and the potentials of the bit lines BL and BLB are corrected by the offset voltage information held in the offset holding circuit 2. That is, the voltages of the bit lines BL and BLB are corrected in such a manner that the offset voltage of the sense amplification portion 1 is canceled out. Therefore, although the sensing operation is carried out after the time t35, the sensing operation can be performed without being affected by the offset voltage of the sense amplification portion 1.

As described above, in the fourth embodiment, the detected offset voltage information is held in the offset holding circuit 2. Thus, by detecting the offset voltage information once, the detection result can be used again and again, and a number of times for detecting the offset voltage information can be reduced.

Incidentally, although FIG. 7 illustrates the example where the offset holding circuit 2 and the switching circuit 3 are added to the circuit shown in FIG. 1, the offset holding circuit 2 and the switching circuit 3 similar to those in FIG. 7 may be added to the circuit depicted in FIG. 3 or FIG. 5.

(Fifth Embodiment)

A fifth embodiment corrects the offset voltage information by using fuses.

Figure 9:
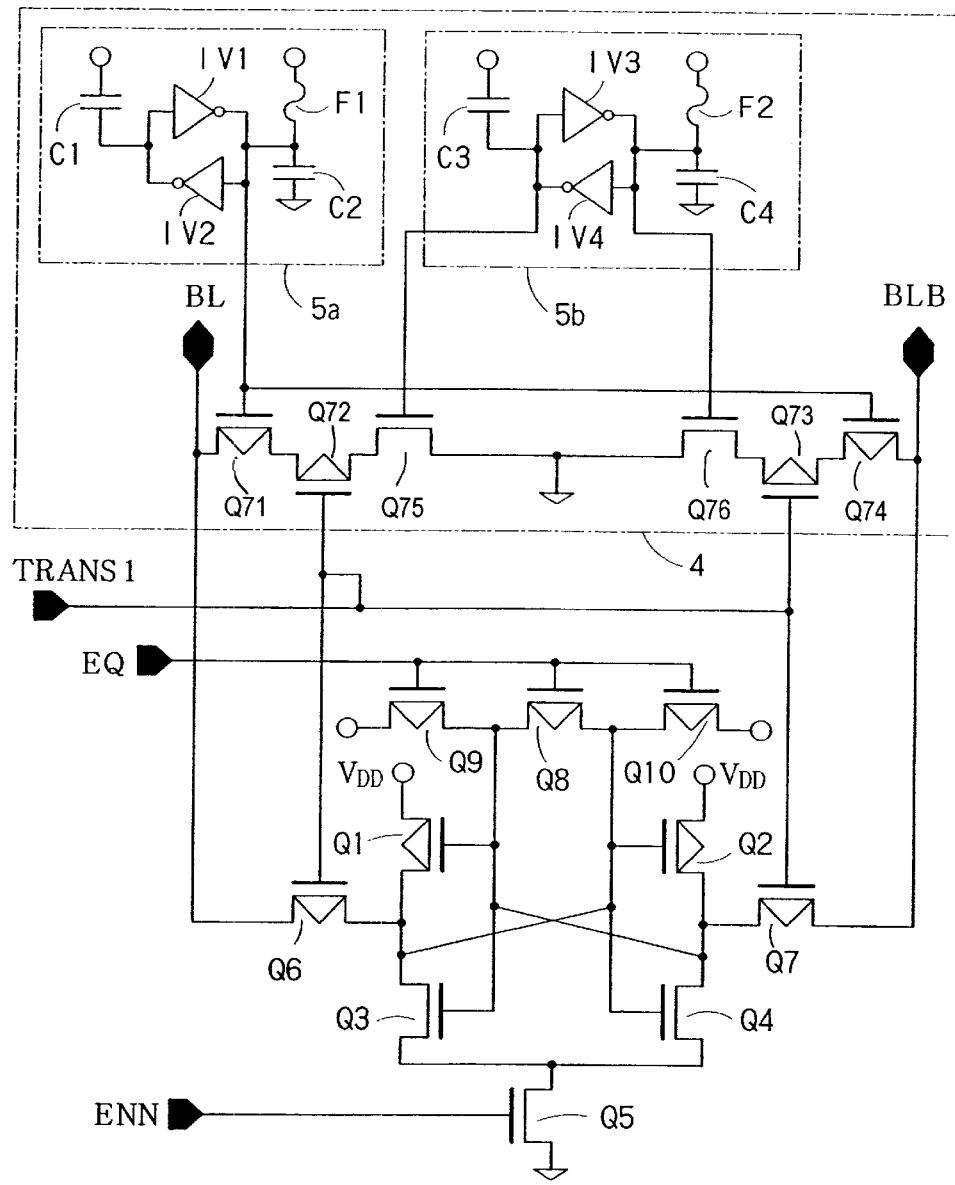
FIG. 9 is a circuit diagram showing a fifth embodiment of a semiconductor integrated circuit according to the present invention.

FIG. 9 is a circuit diagram showing the fifth embodiment of a semiconductor integrated circuit according to the present invention. The circuit depicted in FIG. 9 has the structure in which an offset adjustment circuit 4 is added to the circuit similar to that in FIG. 1.

The offset adjustment circuit 4 has voltage switching portions 5a and 5b, PMOS transistors Q71 to Q74, and NMOS transistors Q75 and Q76.

The voltage switching portion 5a has a coupling capacitor C1, a latch circuit composed of inverters IV1 and IV2, and a fuse F1 and a capacitor C2 connected in series between the power supply terminal and the ground terminal.

Moreover, the voltage switching portion 5b has a coupling capacitor C3, a latch circuit composed of inverters IV3 and IV4, and a fuse F2 and a capacitor C4 connected in series between the power supply terminal and the ground terminal.

An output from the voltage switching portion 5a is inputted to the gate terminal of the PMOS transistor Q71, and an output from the voltage switching portion 5b is inputted to the gate terminals of the NMOS transistors Q75 and Q76. Signals TRANS1 are inputted to the gate terminals of the PMOS transistors Q72 and Q73.

In the state where the fuses F1 and F2 in the voltage switching portions 5a and 5b are not disconnected, the left terminal of the latch circuit rises to the high level and the right terminal of the same falls to the low level. When the fuses F1 and F2 are disconnected, the left terminal of the latch circuit falls to the low level and the right terminal rises to the high level.

For example, in case of increasing the margin for sensing the state in which the potential of the bit line BL is higher than that of the bit line BLB (hereinafter, the state is called "1" reading state), only the fuse F1 of the voltage switching portion 5a is disconnected. At this moment, after power on, the output terminal of the voltage switching portion 5a falls to the low level, and the PMOS transistor Q71 is turned on. At this moment, the left output terminal of the voltage switching portion 5b is on the low level, and the right output terminal of the same is on the high level. Therefore, when the signal TRANS1 falls to the low level, the voltage of the bit line BL is controlled so as to be higher than that of the bit line BLB, thereby improving the margin of the "1" reading state.

On the other hand, in case of increasing the margin for sensing the state in which the potential of the bit line BL is lower than that of the bit line BLB (hereinafter, the state is called "0" reading state), the both fuses F1 and F2 of the voltage switching portions 5a and 5b are disconnected. At this moment, after power on, the output terminal of the voltage switching portion 5a falls to the low level, the left output terminal of the voltage switching portion 5b rises to the high level, and the right output terminal of the voltage switching portion 5b falls to the low level. Therefore, when the signal TRANS1 falls to the low level, the voltage of the bit line BL is controlled so as to be lower than that of the bit line BLB, thereby improving the margin of the "0" reading state.

As described above, in the fifth embodiment, since the voltages of the bit lines BL and BLB can be corrected by switching whether the fuses F1 and F2 are disconnected, the offset adjustment does not have to be again carried out even if the power supply is again turned on after turning off the power supply once.

It is to be noted that the offset adjustment may be effected by means other than the fuses. For example, data for the offset adjustment may be stored in the non-volatile memory in advance, and the offset adjustment may be performed by reading that data.

(Sixth Embodiment)

A sixth embodiment is a modification of the fifth embodiment, and adjusts the offset voltage by directly adjusting the voltage level of the output terminal of the sense amplifier.

Figure 10:
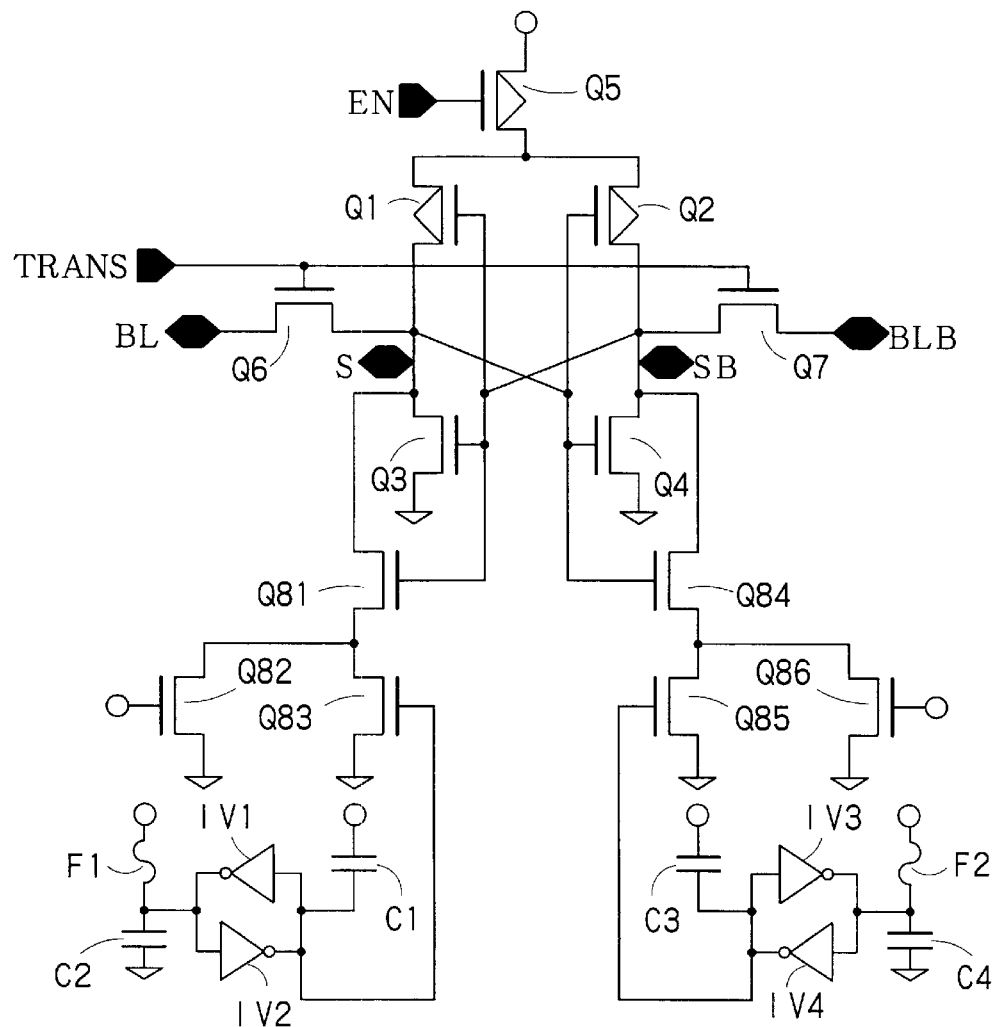
FIG. 10 is a circuit diagram showing a sixth embodiment of a semiconductor integrated circuit according to the present invention.
Figure 11:
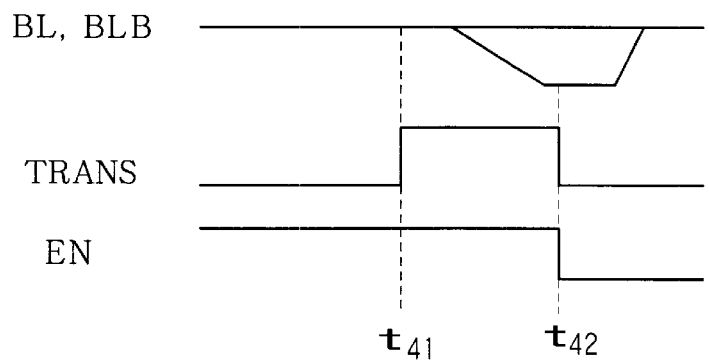
FIG. 11 is an operational timing chart of the circuit illustrated in FIG. 10.

FIG. 10 is a circuit diagram of a sixth embodiment of a semiconductor integrated circuit according to the present invention, and FIG. 11 is an operation timing chart of the circuit illustrated in FIG. 10. The circuit depicted in FIG. 10 does not have a function for detecting the offset voltage as different from the circuits according to the first to fifth embodiments mentioned above. The offset voltage is detected by using, for example, a non-illustrated tester and the like.

The circuit shown in FIG. 10 has: a transistor Q81 having a drain terminal and a gate terminal being connected to a drain terminal and a gate terminal of a transistor Q3; transistors Q82 and Q83 connected in parallel between the source terminal of the transistor Q81 and the ground terminal; a transistor Q84 having a drain terminal and a gate terminal being connected to a drain terminal and a gate terminal of a transistor Q4; transistors Q85 and Q86 connected in parallel between a source terminal of the transistor Q84 and the ground terminal; inverters IV1 and IV2 and a capacitor C1 connected to a gate terminal of the transistor Q83; a fuse F1 and a capacitor C2 connected to the other ends of the inverters IV1 and IV2; inverters IV3 and IV4 and a capacitor C3 connected to a gate terminal of the transistor Q85; and a fuse F2 and a capacitor C4 connected to the other ends of the inverters IV3 and IV4.

When the signal TRANS rises to the high level at the time t41 in FIG. 11, the both transistors Q6 and Q7 are turned on. When the transistors Q6 and Q7 are in the ON state, data is fetched to the flip flop through the bit lines BL and BLB. When the signal EN falls to the low level at the time t42, the data fetched to the flip flop is latched.

For example, when it is found that the margin of the "1" reading state must be increased as a result of detecting the offset voltage by, e.g., a tester, the fuse F2 is disconnected. Consequently, after power on, the connection point between the fuse F2 and the capacitor C4 falls to the low level, which turns on the transistor Q85 the potential of the node SB is controlled so as to lower, and the low level voltage of the bit line BLB is further easily sensed. As a result, the margin of the "1" reading state is increased.

On the other hand, when it is found that the margin of the bit line BL on the low level side must be increased, the fuse F1 is disconnected. Consequently, after power on, the connection point between the fuse F1 and the capacitor 2 falls to the low level, thereby turning on the transistor Q83. The potential of the node S is controlled so as to lower, and the low level voltage of the bit line BL is further easily sensed. As a result, the margin of the "0" reading state is increased.

In the circuit shown in FIG. 10, in the usual state where the fuses F1 and F2 are not disconnected, the transistor Q83 is in the OFF state. Accordingly, the power consumption can be reduced in the usual state. On the other hand, it takes a little time to sense the data.

On the other hand, FIG. 12 is a circuit diagram showing the case where the transistors Q83 and Q85 are in the ON state with the fuses F1 and F2 being not disconnected. In case of FIG. 12, although it is possible to quickly sense in the usual state where the fuses F1 and F2 are not disconnected, the power consumption increases. Therefore, the transition to the low-level voltages of the bit lines BL and BLB becomes late.

Although the transistors Q82, Q83, Q85 and Q86 in FIGS. 10 and 12 are NMOS transistors, they may be made up of PMOS transistors. In this case, the circuit diagram corresponding to FIG. 10 is as shown in FIG. 13, and the circuit diagram corresponding to FIG. 12 is as shown in FIG. 14.

Figure 13:
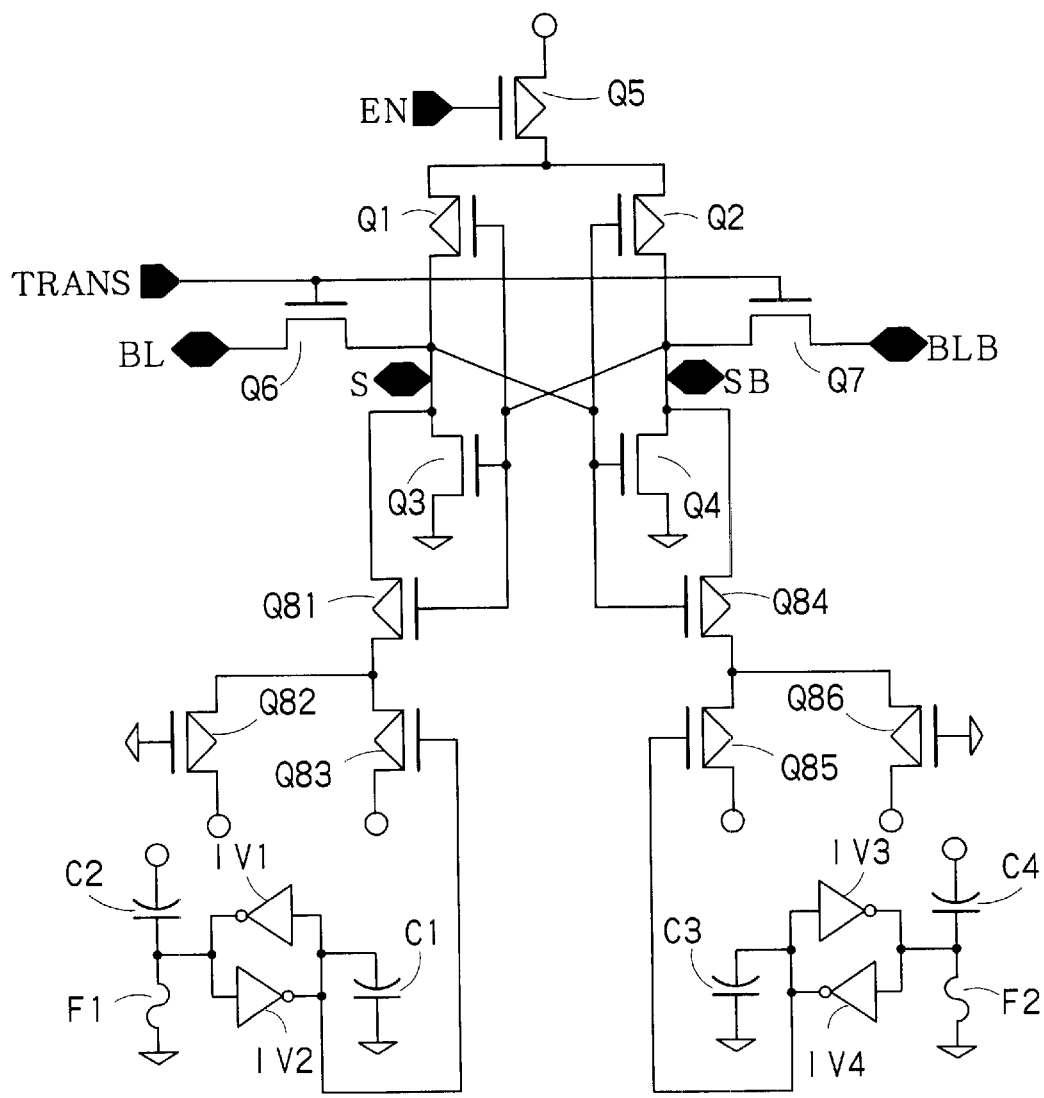
FIG. 13 is a circuit diagram showing a modification of FIG. 10 having a PMOS transistor.

The circuit illustrated in FIG. 13 has the connection relationship between the fuse F1 and the capacitor C2 being reversed from that in FIG. 10. In FIG. 13, when the fuse F1 is disconnected, the transistor Q83 is turned on, the margin of the "1" reading state rises. Furthermore, when the fuse F2 is disconnected, the transistor Q85 is turned on, and the margin of the "0" reading state rises.

On the other hand, the circuit shown in FIG. 14 has the connection relationship between the fuse F1 and the capacitor C2 being reversed from that illustrated in FIG. 12. In FIG. 14, when the fuse F1 is disconnected, the transistor Q83 is turned off, and the margin of the "0" reading state rises. Moreover, when the fuse F2 is disconnected, the transistor Q85 is turned on, and the margin of the "1" reading state rises.

As described above, in the sixth embodiment, since the fuses F1 and F2 for adjusting the voltages of the bit lines BL and BLB are provided and the offset adjustment is carried out so that the offset voltage detected by using, e.g., a tester can be decreased, the offset adjustment can be individually performed in the production process, thereby improving the manufacture yield.

What is claimed is:

1. A semiconductor integrated circuit comprising:
   two input nodes forming a pair;
   two output nodes configured to output amplification signals in accordance with a difference in signals inputted to said two input nodes; and
   at least one switching circuit for switching to a specific state to detect an input offset voltage of said semiconductor integrated circuit before a signal to be amplified is inputted to at least one of said input nodes; and
   said amplification signals are outputted from said two output nodes in a state that the input offset voltage of said semiconductor integrated circuit is corrected.

2. A semiconductor integrated circuit comprising:
   first and second transistors having gate terminals being connected to each other and one drain terminal being connected to the other drain terminal;
   third and fourth transistors having gate terminals being connected to each other and one drain terminal being connected to the other drain terminal;
   a fifth transistor connected between a connection point of said respective drain terminals of said first and second transistors and a first data line;
   a sixth transistor connected between a connection point of said respective drain terminals of said third and fourth transistors and a second data line; and
   an offset supply circuit configured to supply an offset voltage to at least one of said first and second data lines before turning on said fifth and sixth transistors to cancel out an input offset voltage of said semiconductor integrated circuit,
   wherein said connection point of said respective drain terminals of said first and second transistors is connected to said respective gate terminals of said third and fourth transistors, and said respective gate terminals of said first and second transistors are connected to a connection point of the respective drain terminals of said third and fourth transistors.

3. A semiconductor integrated circuit comprising:
   first and second transistors having gate terminals being connected to each other and one drain terminal being connected to the other drain terminal;
   third and fourth transistors having gate terminals being connected to each other and one drain terminal being connected to the other drain terminal;
   a fifth transistor connected between a connection point of said respective drain terminals of said first and second transistors and a first data line;
   a sixth transistor connected between a connection point of said respective drain terminals of said third and fourth transistors and a second data line;
   a seventh transistor connected between said respective gate terminals of said first and second transistors and said first data line; and
   an eighth transistor connected between said respective gate terminals of said third and fourth transistors and said second data line,
   wherein said connection point of said respective drain terminals of said first and second transistors is connected to said respective gate terminals of said third and fourth transistors, and said respective gate terminals of said first and second transistors are connected to said respective drain terminals of said third and fourth transistors.

4. The semiconductor integrated circuit according to claim 3, further comprising an offset control circuit configured to turn on said seventh and eighth transistors, supplying an offset voltage to at least one of said first and second data lines, and thereafter turning on said fifth and sixth transistors in such a manner that an input offset voltage detected in a state where said seventh and eighth transistors are in an OFF mode is canceled out.

5. The semiconductor integrated circuit according to claim 3, further comprising:
   an offset holding circuit configured to hold an input offset voltage detected in a state where said seventh and eighth transistors are in an OFF mode; and
   an offset control circuit configured to supply an offset voltage to at least one of said first and second data lines and thereafter turning on said fifth and sixth transistors based on a voltage held in said offset holding circuit.

6. A semiconductor integrated circuit comprising:
   first and second transistors each having one source terminal being connected to a drain terminal of the other one of said first and second transistors;

third and fourth transistors each having one source terminal being connected to a drain terminal of the other one of said third and fourth transistors; and
a voltage supply circuit configured to counterchange a voltage to be supplied to the drain terminals of said first and third transistors and a voltage to be supplied to the source terminals of said second and fourth transistors depending on whether valid data is supplied to first and second data lines,
wherein said first data line is connected to gate terminals of said first and fourth transistors,
said second data line being connected to gate terminals of said second and third transistors, and
said first to fourth transistors shifting a level of data of said first and second data lines with a predetermined timing.

7. The semiconductor integrated circuit according to claim 6, wherein said offset holding circuit is composed of any of a flip flop, a non-volatile semiconductor memory, and a fuse.

8. A semiconductor integrated circuit comprising:
first and second transistors each having one source terminal being connected to a drain terminal of the other one of said first and second transistors;
third and fourth transistors each having one source terminal being connected to a drain terminal of the other one of said third and fourth transistors;
a fifth transistor connected between the source terminals of said second and fourth transistors and a first voltage terminal;
a sixth transistor connected between the drain terminals of said first and third transistors and a second voltage terminal;
a seventh transistor connected between the drain terminals of said first and third transistors and said first voltage terminal; and
an eighth transistor connected between the source terminals of said second and fourth transistors and said second voltage terminal,
wherein a first data line is connected to gate terminals of said first and fourth transistors, and a second data line is connected to gate terminals of said second and third transistors.

9. The semiconductor integrated circuit according to claim 8, further comprising an on/off control circuit configured to turn on said first, second, third, fourth, fifth and sixth transistors with said seventh and eighth transistors being in an OFF state, and thereafter turn on said seventh and eighth transistors with said fifth and sixth transistors being in the OFF state.

10. The semiconductor integrated circuit according to claim 9, further comprising:
an offset holding circuit configured to hold a voltage of a connection point of said drain terminal and said source terminal of said first and second transistors and a voltage of a connection point of said drain terminal and said source terminal of said third and fourth transistors after turning on said first, second, third, fourth, fifth and sixth transistor and before turning on said seventh and eighth transistors; and
an offset control circuit configured to supply an offset voltage to at least one of said first and second data lines and then turning on said seventh and eighth transistors based on voltages held in said offset holding circuit.

11. The semiconductor integrated circuit according to claim 10, wherein said offset holding circuit is composed of any of a flip flop, a non-volatile semiconductor memory, and a fuse.

12. A semiconductor integrated circuit comprising:
first and second transistors each having one source terminal being connected to a drain terminal of the other one of said first and second transistors;
third and fourth transistors each having one source terminal being connected to a drain terminal of the other one of said third and fourth transistors;
a fifth transistor connected between said source terminals of said second and fourth transistors and a first voltage terminal;
a sixth transistor connected between said drain terminals of said first and third transistors and a second voltage terminal;
a seventh transistor connected between said source terminals of said second and fourth transistors and said second voltage terminal;
an eighth transistor having a gate terminal being connected to a gate terminal of said first transistor and having a drain terminal being connected to said source terminal of said first transistor and a gate terminal of said third transistor;
a ninth transistor having a gate terminal being connected to said gate terminal of said third transistor and having a drain terminal being connected to said source terminal of said third transistor and said gate terminal of said first transistor; and
a tenth transistor connected between source terminals of said eighth and ninth transistors and said first voltage terminal,
wherein a first data line is connected to a gate terminal of said second transistor and a second data line is connected to a gate terminal of said fourth transistor.

13. The semiconductor integrated circuit according to claim 10, further comprising an on/off control circuit configured to turn on said fifth and sixth transistors with said seventh and tenth transistors being in an OFF mode, and thereafter turning on said seventh and tenth transistors wit said fifth and sixth transistors being in the OFF mode.

14. The semiconductor integrated circuit according to claim 12, further comprising:
an offset holding circuit configured to hold a voltage of a connection point of said drain terminal and said source terminal of said first and second transistors and a voltage of a connection point of said drain terminal and said source terminal of said third and fourth transistors after turning on said fifth and sixth transistors and before turning on said seventh and tenth transistors; and
an offset control circuit configured to supply an offset voltage to at least one of said first and second data lines based on voltages held in said offset holding circuit, and thereafter turning on said seventh and eighth transistors.

15. The semiconductor integrated circuit according to claim 14, wherein said offset holding circuit is composed of any of a flip flop, a non-volatile semiconductor memory, and a fuse.

16. A semiconductor integrated circuit comprising:
two input nodes forming a pair;
two output nodes configured to output amplification signals in accordance with a difference in signals inputted to said two input nodes;
at least a pair of internal nodes of signal paths from said input nodes to said output nodes; and
a latch circuit configured to hold a signal inputted from outside said semiconductor integrated circuit, and an input offset adjustment circuit which is connected to any of said input nodes, said internal nodes and said output nodes and controls an input offset voltage of said semiconductor integrated circuit in accordance with data held in said latch circuit.

17. A semiconductor integrated circuit comprising:

first and second transistors having gate terminals being connected to each other and one drain terminal being connected to a drain terminal of the other one of said first and second transistors;

third and fourth transistors having gate terminals being connected to each other and one drain terminal being connected to a drain terminal of the other one of said first and second transistors;

a fifth transistor connected between a connection point of said drain terminals of said first and second transistors and a first data line;

a sixth transistor connected between a connection point of said drain terminals of said third and fourth transistors and a second data line;

a first voltage setting circuit capable of further strongly (further weakly) holding low-level voltages of said gate terminals of said first and second transistors; and a second voltage setting circuit capable of further strongly (further weakly) holding low-level voltage of said gate terminals of said third and fourth transistors, wherein said connection point of said drain terminals of said first and second transistors is connected to said respective gate terminals of said third and fourth transistors, and said respective gate terminals of said first and second transistors are connected to said connection point of said drain terminals of said third and fourth transistors.

18. The semiconductor integrated circuit according to claim 17, wherein said first voltage setting circuit includes:

a first switching circuit configured to switch whether low-level voltages of said gate terminals of said first and second transistors are further strongly (further weakly) held; and a first impedance control circuit configured to set impedance of said gate terminals of said first and second transistors and a low-level reference voltage terminal lower (higher) when further strongly (further weakly) holding low-level voltages of said gate terminals of said first and second transistor by control of said first switching circuit, and wherein said second voltage setting circuit includes:

a second switching circuit configured to switch whether low-level voltages of said gate terminals of said third and fourth transistors are further strongly (further weakly) held; and a second impedance control circuit configured to set impedance of said gate terminals of said third and fourth transistors and a low-level reference voltage terminal lower (higher) when further strongly (further weakly) holding low-level voltages of said gate terminals of said third and fourth transistors by control of said second switching circuit.

19. The semiconductor integrated circuit according to claim 18, wherein said first impedance control circuit includes:

seventh and eighth transistors connected in series between a connection point of said drain terminals of said first and second transistors and said low-level reference voltage terminal; and a ninth transistor connected between a connection point of said seventh and eighth transistors and said low-level reference voltage terminal, said ninth transistor being constantly set in an ON mode, said seventh transistor being on/off-controlled by gate voltages of said first and second transistors, said eighth transistor being on/off-controlled by said first switching circuit, said second impedance control circuit including:

tenth and eleventh transistors connected in series between a connection point of said drain terminals of said first and second transistors and said low-level reference voltage terminal; and a twelfth transistor connected between a connection point of said tenth and eleventh transistors and said low-level reference voltage terminal, said twelfth transistor being constantly set in the ON mode, said tenth transistor being on/off-controlled by gate voltages of said third and fourth transistors, and said twelfth transistor being on/off-controlled by said second switching circuit.

20. A semiconductor integrated circuit comprising:

first and second transistors having gate terminals being connected to each other and one drain terminal being connected to a drain terminal of the other one of said first and second transistors;

third and fourth transistors having gate terminals connected to each other and one drain terminal being connected to a drain terminal of the other one of said first and second transistors;

a fifth transistor connected between a connection point of said drain terminals of said first and second transistors and a first data line;

a sixth transistor connected between a connection point of said drain terminals of said third and fourth transistors and a second data line;

a first voltage setting circuit capable of further strongly (further weakly) holding high-level voltages of said gate terminals of said first and second transistors; and a second voltage setting circuit capable of further strongly (further weakly) holding high-level voltages of said gate terminals of said third and fourth transistors, wherein said connection point of said drain terminals of said first and second transistors is connected to said respective gate terminals of said third and fourth transistors, and said respective gate terminals of said first and second transistors are connected to said connection point of said drain terminals of said third and fourth transistors.

21. The semiconductor integrated circuit according to claim 20, wherein said first voltage setting circuit includes:

a first switching circuit configured to switch whether high-level voltages of said gate terminals of said first and second transistors are further strongly (further weakly) held; and a first impedance control circuit configured to set impedance of said gate terminals of said first and second transistors and a high-level reference voltage terminal lower (higher) when further strongly (further weakly) holding said high-level voltages of said gate terminals of said first and second transistors by control of said first switching circuit, and wherein said second voltage setting circuit includes:

a second switching circuit configured to switch whether high-voltages of said gate terminals of said third and fourth transistors are further strongly (further weakly) held; and a second impedance control circuit configured to set impedance of said gate terminals of said third and fourth transistors and said high-level reference voltage terminal lower (higher) when further strongly (further weakly) holding said high-level voltages of said gate terminals of said third and fourth transistors by control of said second switching circuit.

22. The semiconductor integrated circuit according to claim 21, wherein said first impedance control circuit includes:

seventh and eighth transistors connected in series between said connection point of said drain terminals of said first and second transistors and said high-level reference voltage terminal; and a ninth transistor connected between a connection point of said seventh and eighth transistors and said high-level reference voltage terminal, said ninth transistor being constantly set in an ON mode;

said seventh transistor being on/off-controlled by gate voltages of said first and second transistors, said eighth transistor being on/off-controlled by said first switching circuit, said second impedance control circuit includes:

tenth and eleventh transistors connected in series between said connection point of said both drain terminals of said first and second transistors and said high-level reference voltage terminal; and a twelfth transistor connected between a connection point of said tenth and eleventh transistors and said high-level reference voltage terminal, said twelfth transistor being constantly set in the ON mode, said tenth transistor being on/off-controlled by gate voltages of said third and fourth transistors, and said twelfth transistor being on/off-controlled by said second switching circuit.

23. The semiconductor integrated circuit according to claim 1, wherein switching circuit is capable of cut off a current path in accordance with an outside control signal.

* * * * *

UNITED STATES PATENT AND TRADEMARK OFFICE
CERTIFICATE OF CORRECTION

PATENT NO. : 6,584,026 B2
DATED : June 24, 2003
INVENTOR(S) : Atsushi Kawasumi

It is certified that error appears in the above-identified patent and that said Letters Patent is hereby corrected as shown below:

<u>Title page,</u>
Item [57], ABSTRACT,
Line 1, "tow" has been replaced with -- two --.

Signed and Sealed this

Eleventh Day of November, 2003

JAMES E. ROGAN
*Director of the United States Patent and Trademark Office*